United States Patent [19]

Kiraly

[11] Patent Number: 5,594,379
[45] Date of Patent: Jan. 14, 1997

[54] METHOD AND CIRCUIT TO ELIMINATE FALSE TRIGGERING OF POWER DEVICES IN OPTICALLY COUPLED DRIVE CIRCUITS CAUSED BY DV/DT SENSITIVITY OF OPTOCOUPLERS

[75] Inventor: Laszlo Kiraly, El Segundo, Calif.

[73] Assignee: International Rectifier Corporation, El Segundo, Calif.

[21] Appl. No.: 499,306

[22] Filed: Jul. 7, 1995

[51] Int. Cl.[6] .......................... H03K 17/16; H03K 17/30
[52] U.S. Cl. ................ 327/381; 327/379; 327/26; 327/34
[58] Field of Search .................... 327/379, 381, 327/108, 110, 432, 482, 215, 172, 174, 34, 35, 18, 26; 326/51

[56] References Cited

U.S. PATENT DOCUMENTS

| | | | |
|---|---|---|---|
| 3,473,115 | 10/1969 | Oliver | 327/26 |
| 3,751,689 | 8/1973 | Hogg | 326/51 |
| 3,863,244 | 1/1975 | Lichtblau | 327/34 |
| 3,944,934 | 3/1976 | Francis | 327/174 |
| 4,786,823 | 11/1988 | Abe et al. | 327/34 |
| 4,795,915 | 1/1989 | Sun et al. | 327/34 |
| 5,225,687 | 7/1993 | Jason | 327/514 |
| 5,493,538 | 2/1996 | Bergman | 327/26 |

*Primary Examiner*—Timothy P. Callahan
*Assistant Examiner*—My-Trang Nu Ton
*Attorney, Agent, or Firm*—Ostrolenk, Faber, Gerb & Soffen, LLP

[57] ABSTRACT

A circuit for eliminating false triggering of a power device in an optically coupled drive circuit caused by dv/dt sensitivity of an optocoupler of the drive circuit comprising a latch circuit having an input coupled to an output of the optocoupler and having an inhibit input; and an inhibit signal generating circuit coupled to an output of the latch circuit for providing an inhibit signal of a preset period of time to the inhibit input of the latch circuit when the output of the latch circuit changes state, thereby inhibiting the passage of any high dv/dt spurious or noise signals to the output of the latch circuit during the preset period of time.

14 Claims, 5 Drawing Sheets

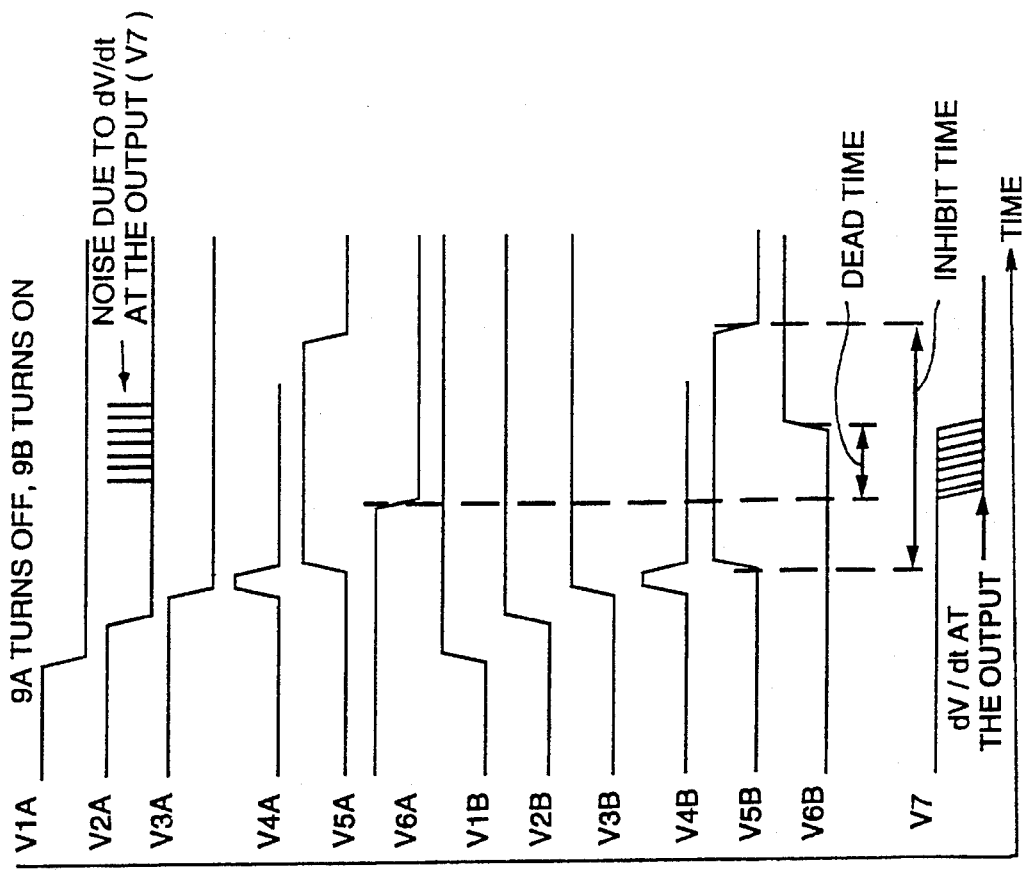
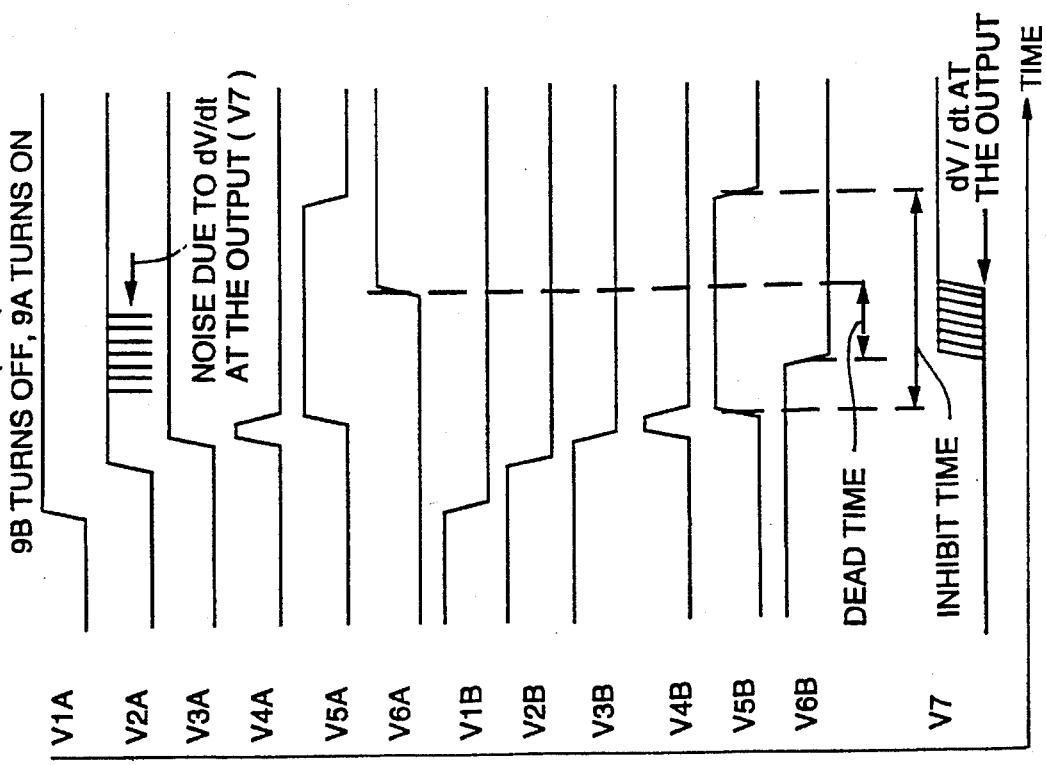

5,594,379

METHOD AND CIRCUIT TO ELIMINATE FALSE TRIGGERING OF POWER DEVICES IN OPTICALLY COUPLED DRIVE CIRCUITS CAUSED BY DV/DT SENSITIVITY OF OPTOCOUPLERS

BACKGROUND OF THE INVENTION

The present invention relates to power device drive circuits, and in particular, such drive circuits incorporating optocouplers. Even more particularly, the invention relates to circuits for eliminating false triggering of power devices due to dv/dt sensitivity of optocouplers used in the driver circuits. For example, the driver circuit may drive the gate or base of a power transistor circuit. The present invention can be applied to an optocoupler which drives the gate or base of a power transistor switching circuit, for example, a bipolar transistor, MOSFET or IGBT switching circuit. The present invention thus relates to a circuit for eliminating false triggering of power devices due to dv/dt or noise sensitivity of optocouplers in the gate drive circuit.

Optocouplers are often used to provide electrical isolation between the control circuit and the power transistor device in various applications. Problems arise when the voltage across the isolation barrier of the opto-isolator changes very rapidly. The output of the optocoupler can be erroneous because the receiver in the optocoupler cannot distinguish between the control signal and the noise signal through the stray capacitance between the transmitter of the optocoupler and the receiver of the optocoupler.

An optocoupler with appropriate control signals and biasing circuit is shown schematically in FIG. 1. FIG. 2 shows waveforms in the circuit of FIG. 1. In the optocoupler, a light emitting diode typically controls the isolated output. In FIG. 1, V0 is low when the LED is not energized and V0 is high when the LED is energized. As shown in FIG. 2, when the voltage V1 is 0, i.e., the switch is open, the output V0 of the optoisolator is commanded to zero. When the voltage B3, which represents the voltage across the isolation barrier of the opto-isolator, changes rapidly, the output of the optocoupler can be erroneous. When the optocoupler is used to control a power device, the dv/dt generated false output can destroy the power device. For example, when B3 changes rapidly, the output V0 of the optocoupler goes momentarily high as shown at 10 in FIG. 2. When V1 goes high, the output V0 of the opto-isolator is normally commanded high, as shown in FIG. 2. However, dv/dt generated by B3 can cause the output to go low momentarily, as shown at 20, which corresponds to the trailing edge of dv/dt. Also, shown in FIG. 2 is a negative going spike dv/dt 30 which can manifest itself as a corresponding spike 40 in the signal V0. Similarly, a positive going dv/dt spike 50 can manifest itself as a negative going spike 60 in the signal V0 at the output of the optocoupler.

FIG. 3 shows a typical prior art drive circuit incorporating optocouplers. The circuit includes a respective optocoupler 1, 2 for each power device 9A, 9B, a respective buffer stage 7A, 7B, respective coupling resistors 8A, 8B and recirculating diode 10A and 10B. The load 11, 12 is connected to output V7.

In this circuit, assuming transistor 9A is off, when V1B goes low (0V), transistor 9B turns off and the output impedance of the circuit increases to a large value because both transistors 9A and 9B are off. Optocoupler 2A is then subject to dv/dt stress if the output voltage V7 changes, which can only occur when both transistors 9A and 9B are off. During this time, optocoupler 2A can generate a false output and turn transistor 9A on and off, increasing switching losses and possibly destroying the device. At some later time, V1A is commanded high and transistor 9A turns on.

In the prior art drive circuit, which may be a bipolar, MOS or IGBT gate drive circuit, the erroneous output of the optocoupler can cause misfiring and destruction of the power devices.

The dv/dt sensitivity of the optocoupler itself can be changed only by changing the internal construction of the optocoupler, e.g. by reducing capacitances, adding shielding, etc. The invention seeks to eliminate the effect of erroneous optocoupler outputs.

The invention is based on the realization that in most applications, the occurrence by dv/dt stress is predictable, and by temporarily disabling the receiver output of the optocoupler or the electronic circuit coupled to the receiver output, the dv/dt generated noise spike can be rejected or eliminated from reaching the power device control electrode.

SUMMARY OF THE INVENTION

It is, accordingly, an object of the present invention to provide a circuit which eliminates false triggering of power devices in optically coupled drive circuits due to the dv/dt sensitivity of the optocoupler of the drive circuit.

It is a further object of the present invention to provide a circuit for use with optocouplers which will prevent spurious or stray signals from being transmitted to the controlled circuits coupled to the outputs of the optocouplers.

The above and other objects of the present invention are achieved by a circuit for eliminating false triggering of a power device coupled to an optically coupled drive circuit caused by dv/dt sensitivity of an optocoupler of the drive circuit comprising a latch circuit having an input adapted to be coupled to an output of the optocoupler and having an inhibit input; and an inhibit signal generating circuit coupled to an output of the latch circuit for providing an inhibit signal of a preset period of time to the inhibit input of the latch circuit when the output of the latch circuit changes state, thereby inhibiting the passage of any spurious signals to the output of the latch circuit during the preset period of time.

The objects of the present invention are also achieved by a method for eliminating false triggering of a power device coupled to an optically coupled drive circuit caused by dv/dt sensitivity of an optocoupler of the drive circuit comprising latching an output signal of the optocoupler; generating a latched signal in response to the optocoupler output signal; generating an inhibit signal of a preset period of time when the latched signal occurs; and using the inhibit signal to prevent any change in the latched signal for the preset period of time.

Other objects, features and advantages of the present invention will become apparent from the detailed description which follows.

BRIEF DESCRIPTION OF THE DRAWINGS

The invention will now be described in greater detail in the following detailed description with reference to the drawings in which.

DETAILED DESCRIPTION OF THE INVENTION

Figure 1:
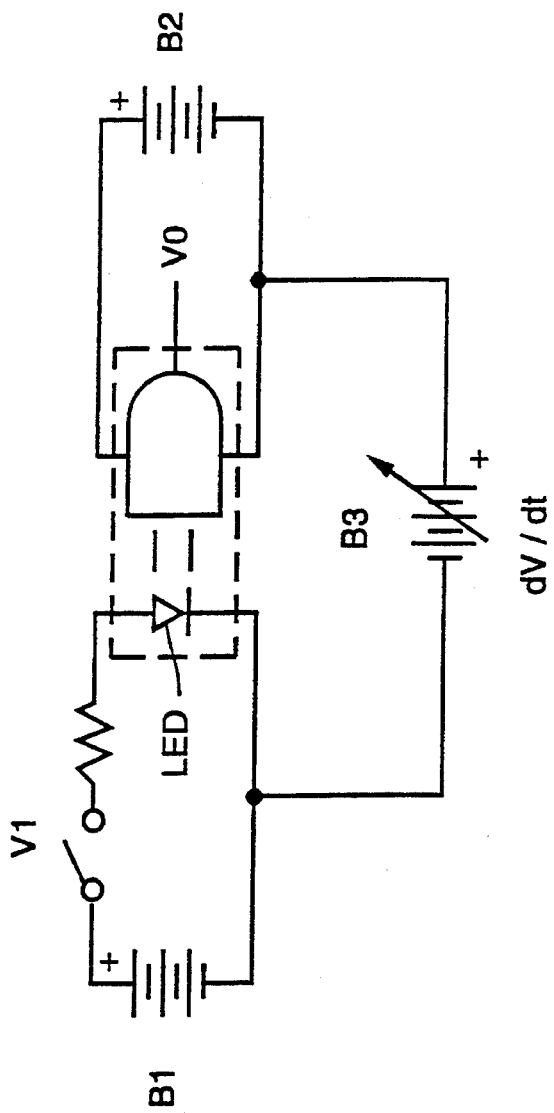
FIG. 1 shows a schematic diagram of an optocoupler for explanation of the problem to be solved by the present invention.
Figure 2:
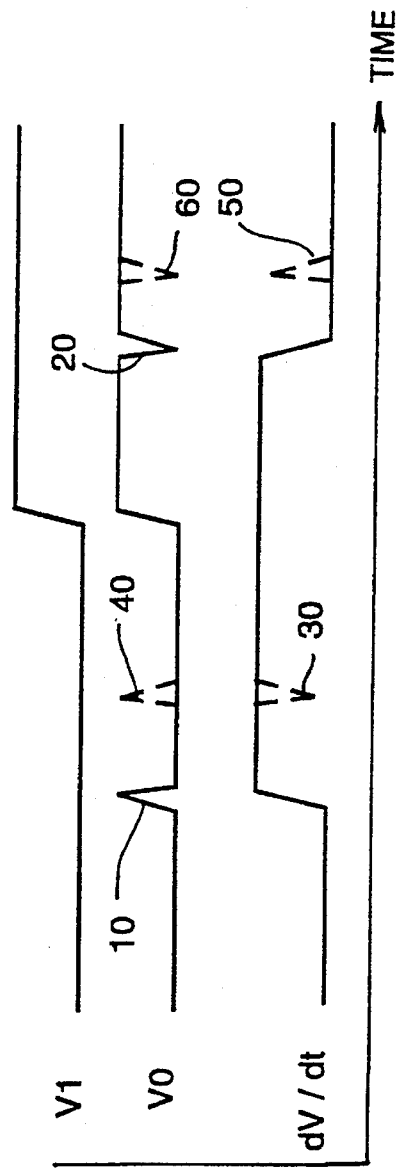
FIG. 2 shows waveforms in the circuit of FIG. 1 and illustrating the spurious signals which are intended to be eliminated by the present invention.
Figure 3:
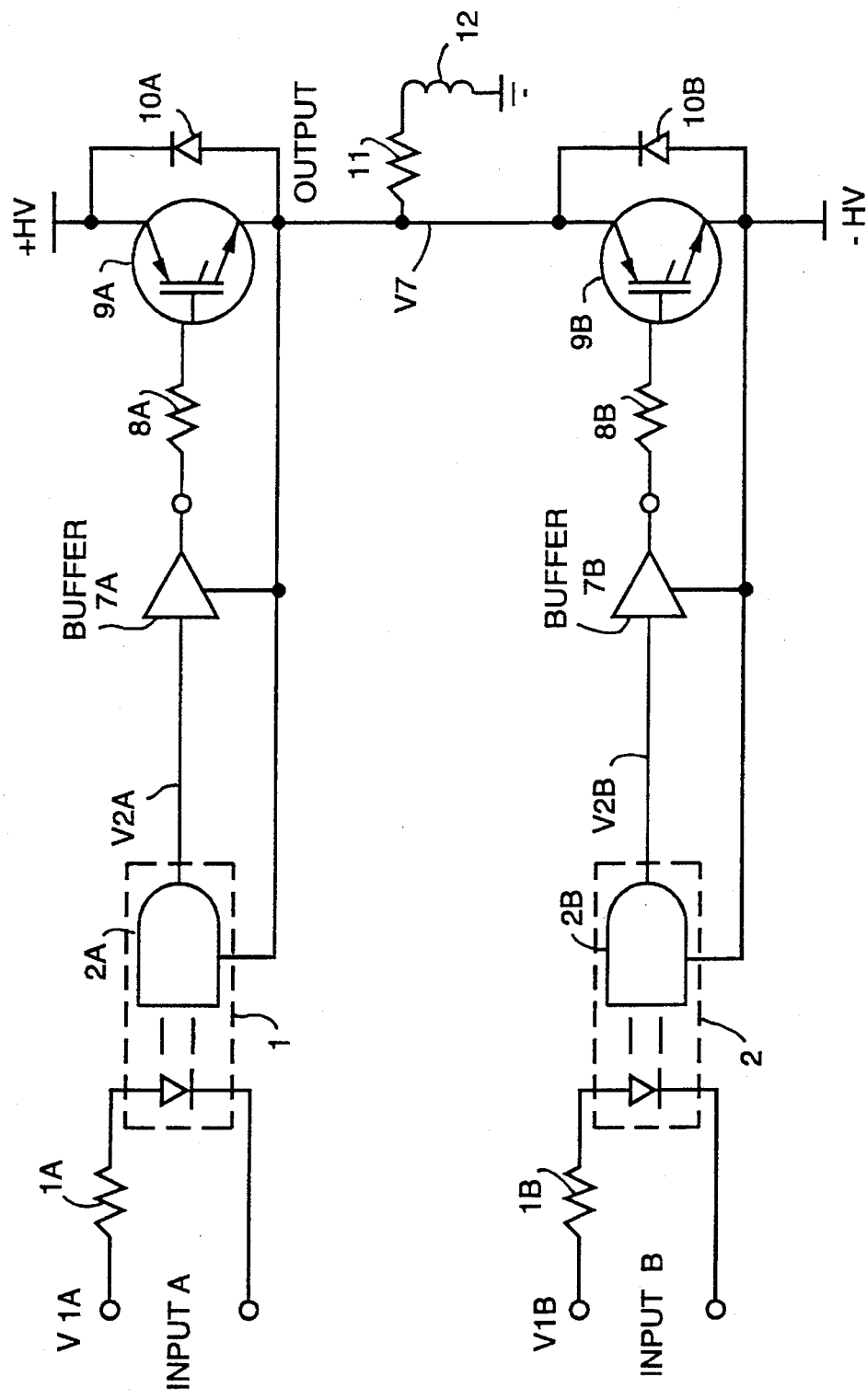
FIG. 3 shows a typical prior art optically coupled driver circuit.
Figure 4:
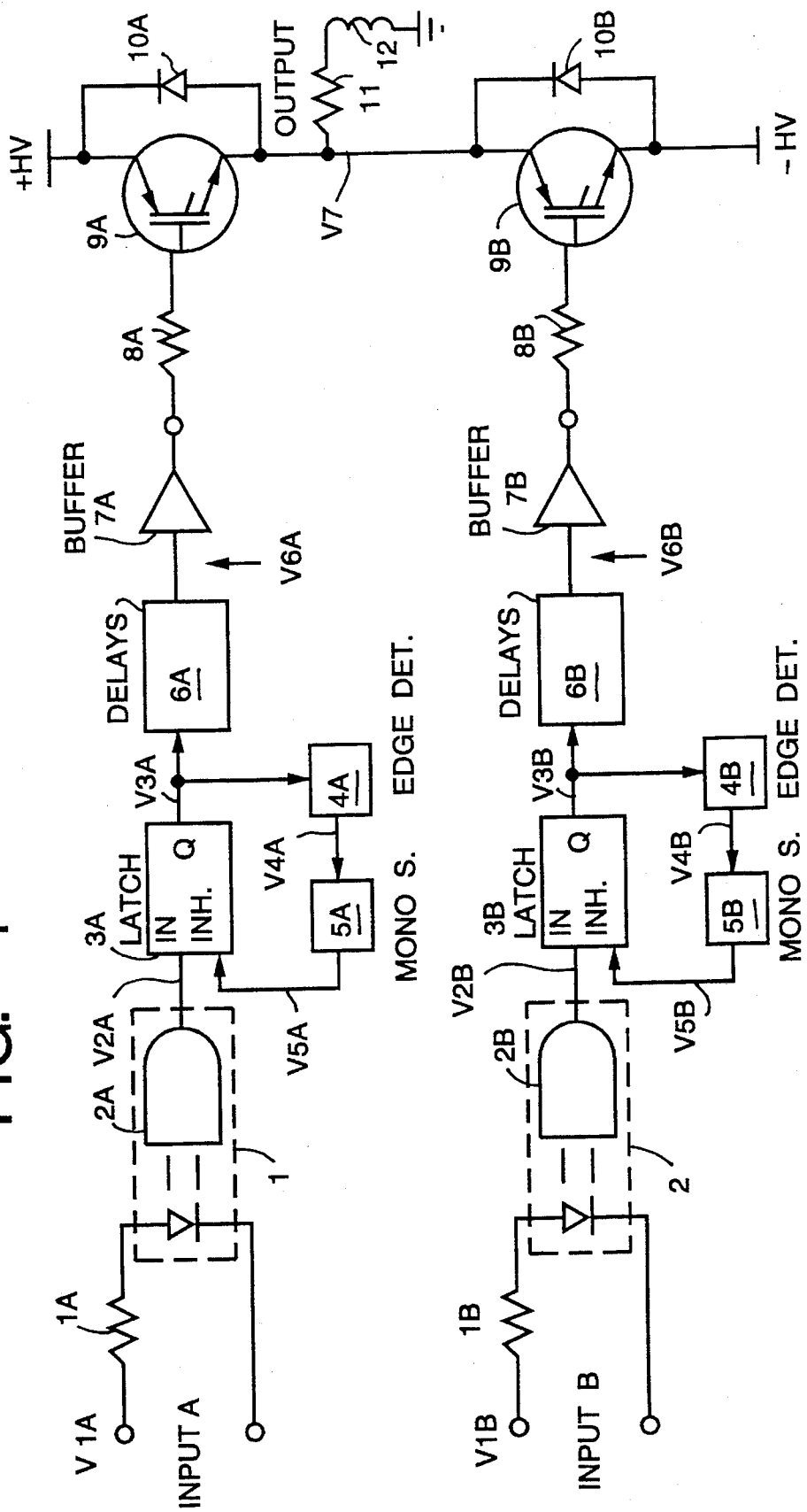
FIG. 4 shows a driver circuit incorporating the present invention for eliminating the effects of dv/dt sensitivity of optocouplers.

With reference now to the drawings, FIG. 4 shows a circuit according to the present invention for eliminating false triggering of power devices in an optically coupled drive circuit caused by dv/dt sensitivity of the optocoupler. As shown in FIG. 4, an optocoupler is provided in the gate drive circuitry for each of two power switching transistors 9A and 9B, illustratively shown as IGBTs in FIG. 4. A voltage V1A is provided to the input of optocoupler 1 and a voltage V1B is provided to the input of optocoupler 2. The output circuits 2A and 2B of the respective optocouplers 1 and 2 provide respective signals V2A and V2B which are provided to the inputs of respective Q flip flop latches 3A, 3B. The outputs of the latches 3A, 3B are respective signals V3A, V3B which are provided to respective delay stages 6A, 6B. The delay stages 6A, 6B are a symmetrical, i.e., they are constructed so that the delay on a rising edge of signal V3A, V3B is greater than the delay on a falling edge of the signal V3A, V3B. The output of the respective delay stage 6A, 6B is a respective signal V6A, V6B which is provided to the input of a respective buffer 7A, 7B. The output of the respective buffer 7A, 7B is provided through a respective resistor 8A, 8B to the gate of the respective power switch 9A, 9B. The output coupled to the load 11 and 12 is taken at the point between the power switches 9A and 9B which is designated V7.

The output of each of the latches 3A and 3B is also provided to a respective edge detector 4A, 4B, the respective output V4A, V4B of which is provided to a respective monostable multivibrator 5A, 5B. The output V5A, V5B is provided to an inhibit input of the respective Q latch 3A, 3B.

Figure 5:
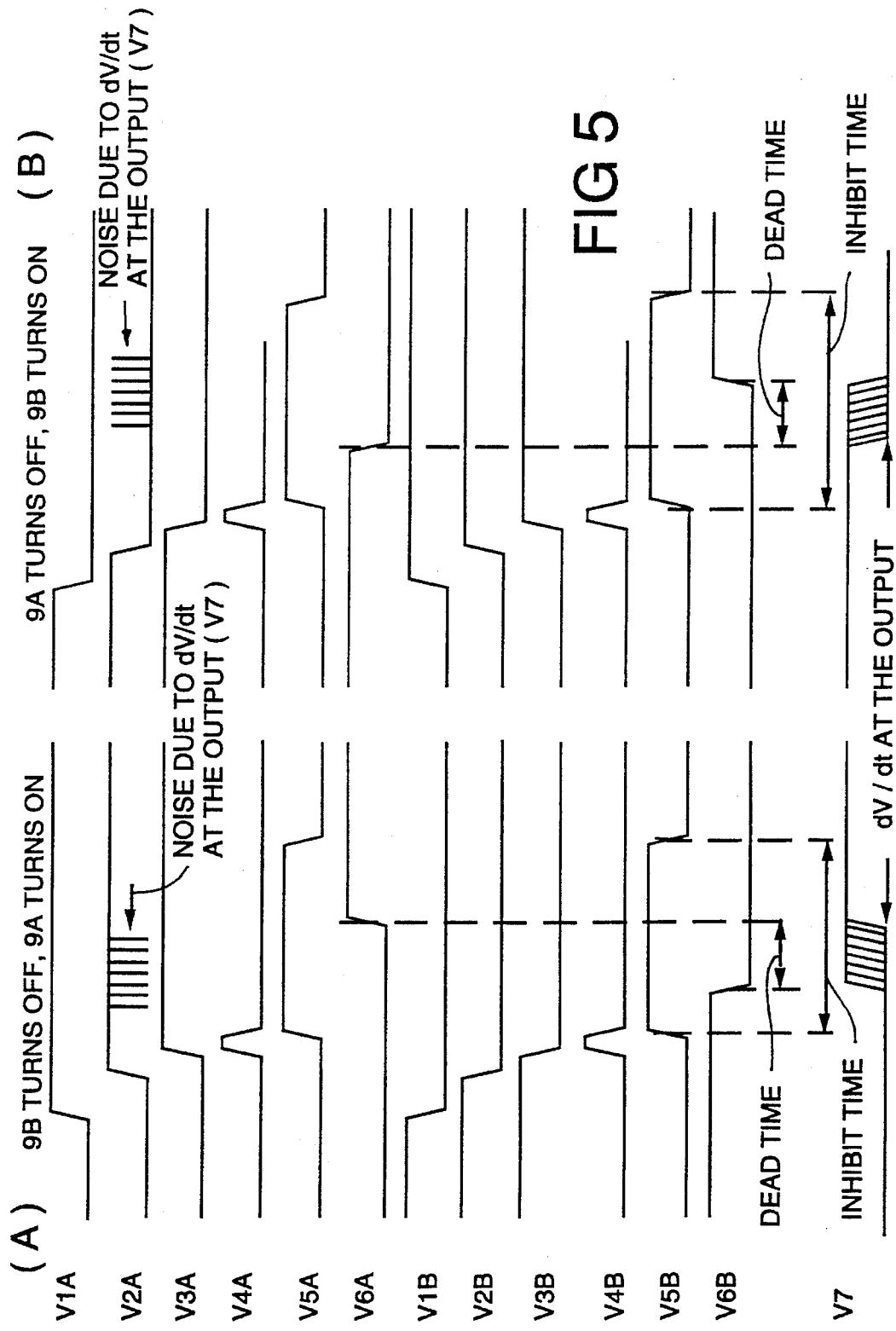
FIG. 5 is a timing diagram of the signals present in the circuit of FIG. 3.

Turning now to FIG. 5, this shows the signals in the diagram of FIG. 4. On the left side of FIG. 5, designated with (A), the operation that is being performed is that transistor 9B is turning off while transistor 9A is turning on. On the right side of FIG. 5, designated (B), the operation is that the transistor 9A is turning off and the transistor 9B is turning on.

Assume first that device 9B is on and device 9A is off. V1A is thus low and V1B is high. V7 is clamped to −HV and therefore no dv/dt stress is placed on optocoupler 2A. In order to change the output (V7) from −HV to +HV, device 9B needs to be turned off and device 9A turned on.

As shown in FIG. 5, side (A), when a signal V1A going high to turn transistor 9A on occurs, approximately simultaneously a signal V1B to turn transistor 9B off occurs A short time later, the output V2A of the optocoupler 1 goes high and the output V2B of the optocoupler 2 goes low. However, because of noise at the output V7 due to dv/dt (see signal V7), negative going spike signals appear on the signal V2A, as shown in FIG. 5. The optocoupler output signal V2A is fed to the input of the latch 3A and outputted as the signal V3A, which goes high a short time after signal V2A goes high, as shown in FIG. 5. The edge detector 4A detects the positive going edge of signal V3A and generates a pulse signal V4A, as shown in FIG. 5. The monostable multivibrator 5A then produces a signal V5A as shown in FIG. 5 which has a preset period. The signal V5A inhibits any noise on signal V2A, such as the noise due to dv/dt as shown in FIG. 5 on the signal V2A, from being passed through as the signal V3A. The clean signal V6A appears at the output of the delay stage 6A a certain delay time after the signal V5A has gone high.

At the same general time that the above has occurred in the control circuit driving the transistor 9A, the control signal V1B has gone low, as shown in FIG. 5, side (A). A short time later, the output V2B of the optocoupler 2 goes low, the output of the latch 3B goes low, edge detector 5B provides a pulse to the monostable multivibrator 5B on the negative edge of the signal V3B, and the signal V5B inhibits the latch 3B for a preset period of time, thereby preventing any stray signals from being transmitted through the latch as the signal V3B. The signal V6B is generated a certain delay time after the signal V3B has gone low. The signal V3B goes low at the same time that signal V3A goes high. As noted, the delay between the signal V3B going low and V6B going low and the delay between V3A and V6A each going high is different. They are asymmetrical delay blocks. In particular, in the embodiment shown, the delay on the rising edge of V3A and V3B is greater than the delay on the falling edge of V3A and V3B. Accordingly, signal V6B goes low (turns 9B off) before signal V6A goes high (turns 9A on).

As shown by timing diagram (A) of FIG. 5, what has occurred is that there is a dead time, as shown in FIG. 5 on the diagram for V6B, between the time when the transistor 9B turns off and transistor 9A turns on, thereby preventing both transistors from being on at the same time. In addition, the inhibit time, as shown in FIG. 5 by the pulse time of V5A and V5B, prevents any stray noise due to dv/dt on signal V2A and V2B from being passed to the gates of the power transistors 9A and 9B. Since the inputs of latch 3A and 3B are still inhibited during the dead time, noise at the output of the optocoupler cannot affect the operation of the circuit and be passed to the power devices.

When transistor 9A turns on, it changes the output (V7) to +HV. After the inhibit time, monostables 5A and 5B release respective latches 3A and 3B and the circuit is ready to accept control from V1A and V1B again.

A similar result occurs when transistor 9A turns off and transistor 9B turns on as shown in the right hand portion of FIG. 5, designated (B). As shown, there may be noise due to dv/dt at the output of V7, when the signal V7 goes low, as shown by the signal V7 at the bottom of FIG. 5, side (B). To prevent this dv/dt signal which is present on the line V2A from being processed by the drive circuitry, the respective latch 3A and 3B in each of the drive circuits-and its accompanying inhibit circuitry is provided. Thus, when V2A goes low, V3A goes low a short time later. The falling edge is detected by the edge detector 4A and a pulse is provided to the monostable multivibrator 5A, which then goes high for a preset period of time. This inhibits the operation of the latch 3A, preventing any of the stray dv/dt noise signals from being transmitted from the line V2A to the line V3A. As shown in FIG. 5, a preset time after the line V3A goes low, the line V6A goes low. As discussed, the delay circuit 6A operates such that it will go low after a falling edge more rapidly than it would go high after a rising edge.

At the same general time that the above is occurring in the drive circuit of the transistor 9A, transistor 9B is being turned on through the following course of action. A positive going signal V1B is received at the input of the optocoupler. A short time later the signal V2B appears at the output of the optocoupler which appears at the output of the latch 3B a short time thereafter. Edge detector 4B then generates a pulse at the rising edge of the signal V3B which causes the monostable multivibrator 5B to go high for a preset period of time, inhibiting operation of the latch 3B. This is shown by the signal V5B in FIG. 5, side (B). Signal V6B goes high a preset delay time after the signal V3B has gone high.

As shown in FIG. 5 at side (B), there is a dead/time between the time that transistor 9A goes off and transistor 9B goes on, thereby preventing both transistors from being on at the same time. In addition, an inhibit time is provided to prevent any stray dv/dt signals from being provided to the gates of the power transistors.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A circuit for preventing false turning on and false turning off of a power device in an optically coupled drive circuit caused by dv/dt sensitivity of an optocoupler of the drive circuit, said circuit comprising:

a latch circuit having a latch input coupled to an output of the optocoupler, a latch output, and an inhibit input for receiving a signal inhibiting said latch output; and an inhibit signal generating circuit coupled to the latch output for detecting a change of state in the latch output and for supplying the inhibit input of the latch circuit with an inhibit signal of preset duration when the latch output change state, thereby preventing said latch circuit from passing to the latch output any spurious signals that are received by the latch input during the preset duration.

2. The circuit of claim 1, wherein the inhibit signal generating circuit comprises an edge detector coupled to the latch output for generating a pulse when the latch output changes state and a monostable element for generating the inhibit signal of the preset duration in response to the pulse generated by the edge detector.

3. The circuit of claim 1, further comprising a delay stage coupled to the latch output for providing a output which includes a delayed signal when the latch output changes state.

4. The circuit of claim 3, wherein the delay stage is edge sensitive such that the delay stage outputs the delayed signal after a different delay time depending on whether the latch output comprises a rising edge or a falling edge.

5. The circuit of claim 4, wherein the delay stage operates with a greater delay when the latch output comprises a rising edge than when the latch output comprises a falling edge.

6. The circuit of claim 4, wherein the circuit has an output comprising the output of the delay stage, said delay stage output being coupled to a control input of a first power transistor switching device.

7. The circuit of claim 6, further comprising an identical circuit coupled to a control input of a second power transistor switching device, said first and second power transistor switching devices being coupled in series with a common connection between them coupled to a load circuit, said delay stage of said identical circuit operating with a greater delay when the latch output of said identical circuit comprises a rising edge than when the latch output of said identical circuit comprises a falling edge so that said delay stage of each circuit together provide a dead time between the turning off of one of said power transistor switching devices and the turning on of an other of said power transistor switching devices so that both said power transistor switching devices cannot be on at the same time.

8. A method for preventing false turning on and false turning off of a power device in an optically coupled drive circuit caused by dv/dt sensitivity of an optocoupler of the drive circuit, said method comprising the steps of:

latching an output signal of the optocoupler;

generating a latched signal in response to the optocoupler output signal;

detecting a change of state in the latched signal;

generating an inhibit signal of a preset duration when a change of state in the latched signal occurs; and using the inhibit signal to prevent any further change in the latched signal for the preset duration, thereby preventing the passing of any spurious signals supplied by the optocoupler.

9. The method of claim 8, wherein the step of detecting a change of state comprises detecting an edge of the latched signal when the latched signal changes states and generating a pulse when the edge is detected; and wherein the step of generating an inhibit signal comprises generating a signal of the preset duration in response to the generated pulse.

10. The method of claim 8, further comprising the step of delaying the latched signal and providing an output which includes a delayed signal when the change of state in the latched signal occurs.

11. The method of claim 10, wherein the step of delaying comprises producing the delayed signal after a different delay time depending on whether the latched signal comprises a rising edge or a falling edge.

12. The method of claim 11, wherein the step of delaying comprises delaying with a greater delay when the latched signal comprises a rising edge than when the latched signal comprises a falling edge.

13. The method of claim 11, further comprising the step of supplying the output to a control input of a first power transistor switching device.

14. The method of claim 13, further comprising the step of supplying a further output to a control input of a second power transistor switching device, said first and second power transistor switching devices being coupled in series with a common connection between them coupled to a load circuit, said further output including a delayed signal having a greater delay when said further output comprises a rising edge than when the further output comprises a falling edge so that said output and said further output together provide a dead time between the turning off of one of said power transistor switching devices and the turning on of an other of said power transistor switching devices so that both said power transistor switching devices cannot be on at the same time.

* * * * *